United States Patent
Distefano et al.

(10) Patent No.: US 6,255,738 B1
(45) Date of Patent: *Jul. 3, 2001

(54) ENCAPSULANT FOR MICROELECTRONIC DEVICES

(75) Inventors: Thomas H. Distefano, Monte Sereno; Craig Mitchell, Santa Clara; Mark Thorson, Saratoga; Zlata Kovac, Los Gatos, all of CA (US)

(73) Assignee: Tessera, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/940,477

(22) Filed: Sep. 30, 1997

Related U.S. Application Data

(60) Provisional application No. 60/027,954, filed on Sep. 30, 1996.

(51) Int. Cl.7 .................................................. H01L 23/29
(52) U.S. Cl. ....................... 257/788; 257/787; 257/789; 257/791; 257/795
(58) Field of Search .................................. 257/791, 789, 257/795, 788, 787; 438/106

(56) References Cited

U.S. PATENT DOCUMENTS

| | | |
|---|---|---|
| 2,938,009 | 5/1960 | Lucas . |
| 3,258,477 | 6/1966 | Plueddemann et al. . |
| 3,635,743 | 1/1972 | Smith . |
| 3,649,320 | 3/1972 | Yates . |
| 3,837,878 | 9/1974 | Beers . |
| 3,996,195 * | 12/1976 | Sato et al. ............................. 528/31 |
| 4,116,919 | 9/1978 | Elias et al. . |
| 4,173,560 | 11/1979 | Homan et al. . |

(List continued on next page.)

OTHER PUBLICATIONS

Wei H. Koh "High Thermal Conductance Liquid Encapsulants For Direct Chip Attach", IEEE, pp. 343–346, May 1996.*

*Primary Examiner*—Stephen D. Meier
*Assistant Examiner*—Maria Guerrero
(74) *Attorney, Agent, or Firm*—Lerner, David, Littenberg, Krumholz & Mentlik, LLP

(57) ABSTRACT

Filled, curable siloxane encapsulant compositions containing a curable siloxane base resin with functional groups reactive with functional groups of a hardener compound to form a polysiloxane, and filler particles with surface functional groups reactive with the hardener compound functional groups, wherein the filler particles have at least a bi-modal particle packing distribution of first filler particles having a first diameter and second filler particles having a second diameter smaller than the first diameter, and the first and second filler particles are present in amounts effective to provide a particle packing distribution with a relative bulk volume of at least about 90 percent. Tri-modal particle packing distributions of the first and second filler particles with third filler particles having a third diameter smaller than the second diameter are preferred, with the first, second and third filler particles being present in amounts effective to provide a tri-modal particle packing distribution with a relative bulk volume of at least about 95 percent. Encapsulant kits, cured encapsulant compositions in which filler particles are individually covalently bonded to one or more polysiloxane polymer chains, microelectronic assemblies incorporating the cured encapsulant compositions, and methods for preparing the curable encapsulant compositions are also disclosed.

70 Claims, 1 Drawing Sheet

U.S. PATENT DOCUMENTS

| | | | |
|---|---|---|---|
| 4,327,369 | * | 4/1982 | Kaplan ............................ 257/788 |
| 4,529,774 | | 7/1985 | Evans et al. . |
| 4,822,830 | | 4/1989 | Adkins . |
| 4,902,732 | * | 2/1990 | Itoh et al. ....................... 523/433 |
| 4,946,878 | | 8/1990 | Jensen et al. . |
| 5,001,011 | | 3/1991 | Plueddemann . |
| 5,006,573 | | 4/1991 | Plueddemann . |
| 5,013,772 | | 5/1991 | Fujiki et al. . |
| 5,032,626 | | 7/1991 | Evans . |
| 5,057,151 | | 10/1991 | Schuster et al. . |
| 5,110,845 | | 5/1992 | Gray et al. . |
| 5,112,885 | | 5/1992 | Inoue et al. . |
| 5,116,886 | | 5/1992 | Wolff et al. . |
| 5,200,440 | | 4/1993 | Takago et al. . |
| 5,213,864 | * | 5/1993 | Wong ............................... 428/76 |
| 5,218,014 | | 6/1993 | Matsumoto et al. . |
| 5,219,922 | | 6/1993 | Steinberger et al. . |
| 5,244,707 | * | 9/1993 | Shores ............................. 428/76 |
| 5,258,650 | * | 11/1993 | Polak et al. .................... 257/788 |
| 5,302,632 | | 4/1994 | Maxson . |
| 5,391,924 | * | 2/1995 | Uchida et al. .................. 257/788 |
| 5,401,781 | | 3/1995 | Hagen . |
| 5,561,176 | | 10/1996 | Garafalo et al. . |
| 5,561,329 | * | 10/1996 | Mine et al. ..................... 257/795 |
| 5,589,714 | * | 12/1996 | Howard ........................... 257/788 |
| 5,591,034 | * | 1/1997 | Ameen et al. .................. 439/91 |

\* cited by examiner

ENCAPSULANT FOR MICROELECTRONIC DEVICES

The present application claims benefit of U.S. Provisional Application Serial No. 60/027,954 filed Sep. 30, 1996, the disclosure of which is incorporated herein by reference.

BACKGROUND OF THE INVENTION

The present invention relates to filled curable polysiloxane encapsulant compositions having bi-modal and tri-modal particle packing distributions of filler particles, in which the filler particles are individually covalently bonded to one or more polysiloxane chains. In particular, the present invention relates to filled curable encapsulant compositions having bi-modal and tri-modal filler particle packing distributions with filler loading levels that maximize the relative bulk volume of the filler particle packing.

In the construction of semiconductor chip package assemblies, it has been found desirable to interpose encapsulating material between or around elements of the semiconductor packages in an effort to reduce or redistribute the strain and stress on the connections between the semiconductor chip and a supporting circuitized substrate during operation of the chip, and to seal the elements against corrosion, as well as to insure intimate contact between the encapsulant, the semiconductor die and the other elements of the chip package.

In the field of elastomeric materials for encapsulating semiconductor chips, most elastomers are poor conductors of heat. This creates difficulties in removing waste heat from semiconductor chips that run hot, such as high-end microprocessors. It also makes it difficult for heat to pass through the package for soldering and de-soldering.

Most elastomers have a high coefficient of thermal expansion (CTE), so that undesirable levels of stress are produced as the various materials used in an semiconductor chip package expand and contract at different rates in response to temperature changes.

Encapsulated metallic conductors such as wire bonds are particularly susceptible to fatigue failures. Typical wire bonds incorporate sharp corners and sharp changes in cross-sectional area at junctions between the fine bonding wire and the connected parts. For example, in a "ball-bond," each fine wire joins a relatively massive ball of wire material at one end. These features tend to create stress concentrations at the junctures. If the wire is flexed repeatedly during service, it can fail at such stress concentrations. When the wire is encapsulated, differential CTE of the chip and encapsulant can cause repeated flexure of the wire and fatigue failure. Attempts have been made to avoid such fatigue failures by using very soft encapsulants such as soft elastomers or gel, at a sacrifice of tensile strength and solvent resistance. Fatigue failure of encapsulated wire bonds remains a significant problem.

A few elastomers have poor solvent resistance. When exposed to certain solvents such as cleaning agents, they swell as they absorb the solvent. Like the stress produced by differences in CTE, the stress produced by solvent swell can also cause package failure. For semiconductor chip packaging, it is important to have good resistance to the cleaning solvents commonly used in the electronics industry, such as esters and terpenes.

U.S. Pat. Nos. 3,649,320; 4,946,878 and 5,001,011 disclose the use of silane coupling agents to improve the mechanical properties of filled thermosetting and thermoplastic resins. A means by which the mechanical properties of curable polysiloxane encapsulant compositions such as Young's modulus and tensile strength may be improved without a sacrifice of thermal conductivity or CTE would be highly desirable.

SUMMARY OF THE INVENTION

The present invention addresses these needs. Filler particles may be incorporated into curable polysiloxane encapsulant compositions to increase the tensile strength and solvent resistance of the encapsulant composition but at the same time reduce CTE and increase the thermal conductivity. Preferred embodiments of the present invention provide curable polysiloxane encapsulant compositions with heretofore unknown combinations of high tensile strength, solvent resistance and thermal conductivity, and low CTE.

In methods according to one aspect of the present invention, filler particles are employed having surfaces modified with coupling agents that covalently bond individual filler particles to one or more polymer chains of the polysiloxane. The polysiloxane is formed by reacting a siloxane and a hardener compound, wherein the siloxane has functional groups reactive with functional groups on the hardener compound. The siloxane and hardener compound are both difunctional so that adjacent siloxanes are linked by the hardener compound. Coupling agents are selected that react with the siloxane compound so that some of the hardener compound covalently bonds individual filler particles to one or more polymer chains of the polysiloxane upon curing, instead of linking together two siloxanes.

Most preferably, the filler has a bi-modal or tri-modal particle size distribution. Such a particle size distribution provides an even greater increase in tensile strength and solvent resistance in the cured encapsulant composition and even greater improvements in thermal conductivity and CTE reduction. The curable encapsulant compositions of the present invention thus possess a particularly advantageous combination of thermal and mechanical properties for use as encapsulant compositions for semiconductor chip packages.

Therefore, according to another aspect of the present invention, a filled curable siloxane encapsulant composition is provided containing a siloxane base resin with functional groups reactive with functional groups of a hardener compound to form a polysiloxane, and filler particles with surface functional groups reactive with the hardener compound functional groups, so that upon curing, the filler particles individually covalently bond to one or more polymer chains of the polysiloxane, wherein the filler particles have least a bi-modal particle packing distribution in the polysiloxane of first filler particles having a first diameter and second filler particles having a second diameter smaller than the first diameter, and the first and second filler particles are present in amounts effective to provide the particle packing distribution with a relative bulk volume of at least about 90 percent.

The term "relative bulk volume" is a measure of the packing density of a particular filler. As further discussed below, in a filler with a bi-modal particle size distribution, the smaller particles can fill empty spaces between larger particles, so that a filler with a bi-modal particle size distribution typically will provide a relative bulk volume higher than an equivalent filler containing only the larger or smaller particles.

The improvement in thermal and mechanical properties increases as the packing density of the filler particles, expressed as relative bulk volume, increases. Thus, even greater improvement in thermal and mechanical properties are obtained when a tri-modal particle packing distribution is employed.

Therefore, according to a preferred embodiment of this aspect of the present invention, the filler particles of the curable polymer encapsulant composition further include third filler particles having a third diameter less than the second diameter so that the encapsulant has a tri-modal particle packing distribution with a relative bulk volume of at least about 95 percent.

The curable encapsulant compositions of the present invention may be employed as part of a two-component encapsulant system in combination with a separately packaged hardener compound for the curable siloxane, wherein the siloxane and hardener are combined immediately prior to use of the encapsulant. In the alternative, the hardener and associated catalysts may be compounded with the curable siloxane and filler materials, provided that prior to use the curable encapsulant composition is maintained at a temperature below that at which the curing reaction takes place. The encapsulant is then cured by heating the curable composition to a temperature at which the curable siloxane and hardener compound react to form a fully cured polysiloxane.

In the alternative, the curable encapsulant compositions of the present invention may further include a hardener compound for the siloxane. As noted above, the encapsulant compositions of the present invention may be employed as a two-component system in which the curable siloxane base resin and the hardener compound are combined together just prior to use of the encapsulant. The present invention therefore also includes encapsulant kits containing the filled, curable encapsulant composition of the present invention, substantially free of the hardener compound and, in a separate package, the hardener compound.

According to yet another aspect of the present invention, a filled polysiloxane encapsulant composition is provided, containing a polysiloxane, at least a portion of the polymer chains of which are covalently bonded on both ends to filler particles, and filler particles individually covalently bonded to one or more of the polysiloxane polymer chains, wherein the filler particles have at least the bi-modal particle packing distribution of the present invention. Preferred cured encapsulant compositions in accordance with the present invention contain filler particles having the tri-modal particle packing distribution of the present invention.

In a preferred cured encapsulant composition according to the present invention, the individual filler particles are covalently bonded to one or more polysiloxane chains by way of a coupling agent. The coupling agent has a first functional group capable of reacting with functional groups on the surface of the filler particles, and a second functional group capable of reacting with the siloxane hardener compound, thereby covalently bonding individual filler particles one or more polymer chains. Filler particles may be pre-treated with a coupling agent having the first and second functional groups, so that the filler particles have a covalently bonded coupling agent coating with second functional groups on the surface thereof capable of reacting with the siloxane hardener compound to covalently bond individual filler particles to one or more polysiloxane polymer chains.

The formation of the covalently bonded coupling agent coating on the surface of the filler particles may also be performed in situ within the mixture, before, or during the curing of the encapsulant compositions of the present invention. Curable encapsulant compositions in accordance with the present invention may therefore be prepared by blending together the curable siloxane base resin, the filler particles and the coupling agent capable of covalently bonding together the filler particles to the cured polysiloxane, with or without the hardener compound for the siloxane. Because first, second and optionally third filler particles are employed of different diameters, pre-treated filler particles may be used in combination with non-treated filler particles that are then treated in situ.

Therefore, in accordance with yet another embodiment of the present invention, a method is provided for the preparation of a filled, curable elastomer encapsulant composition by blending filler particles and a curable siloxane base resin, both having functional groups reactive with functional groups of a hardener compound to form a polysiloxane with filler particles individually covalently bonded to one or more polymer chains of the polysiloxane, wherein the filler particles have at least a bi-modal particle packing distribution of first filler particles having a first diameter and second filler particles having a second diameter smaller than the first diameter, and the first and second filler particles are present in amounts effective to provide the particle packing distribution with a relative bulk volume of at least about 90 percent. In a preferred method in accordance with the present invention, the filler particles further include third filler particles having a third diameter smaller than the second diameter, with the first, second and third filler particles being present in amounts effective to provide a tri-modal particle packing distribution having a relative bulk volume of at least about 95 percent.

After forming a uniform, homogenous blend of the curable siloxane base resin and the filler particles, methods in accordance with the present invention may further include the step of adding to the uniform, homogenous blend a hardener compound for the siloxane. If the encapsulant is not to be used immediately, the method will further include the step of maintaining the blend at a temperature below the temperature of the siloxane curing reaction.

The cured encapsulant compositions of the present invention exhibit improvements in thermal and mechanical properties beyond that which would be expected on the basis of increased particle packing density. Therefore, in yet another aspect of the present invention, there is provided an assembly having a microelectronic element at least partially surrounded by the encapsulant composition of the present invention.

In preferred aspects of this embodiment of the invention, the microelectronic assembly is a semiconductor chip assembly including a semiconductor chip having contacts thereon and flexible leads extending to the contacts, with the encapsulant of the present invention encapsulating the flexible leads.

While not being bound by any particular theory, it is believed that the improved thermal and mechanical properties exhibited by the cured encapsulant compositions of the present invention are attributable to the bi-modal and tri-modal distribution of filler particles that are individually covalently bonded to one or more polysiloxane polymer chains. Unlike conventional elastomer encapsulants, the polymer matrix of the encapsulant compositions of the present invention is constrained from free expansion by the covalent polysiloxane linkages between the filler particles. The flexible polymer chains limit the expansion and the distance between the adjacent, larger first filler particles. The linkages between filler particles will expand up to the limit of the polymer chain length. At this extreme, the polymer chain will reach a maximum extension and greatly limit further expansion. This behavior is observed in shear, linear and three-dimensional expansion. In each case, the distortion or strain is limited because of the linkage of the filler particles by polysiloxane polymer chains.

The foregoing and other objects, features and advantages of the present invention are more readily apparent from the detailed description of the preferred embodiments set forth below, taken in conjunction with the accompanying drawing.

DETAILED DESCRIPTION OF THE PREFERRED EMBODIMENTS

Figure 1:
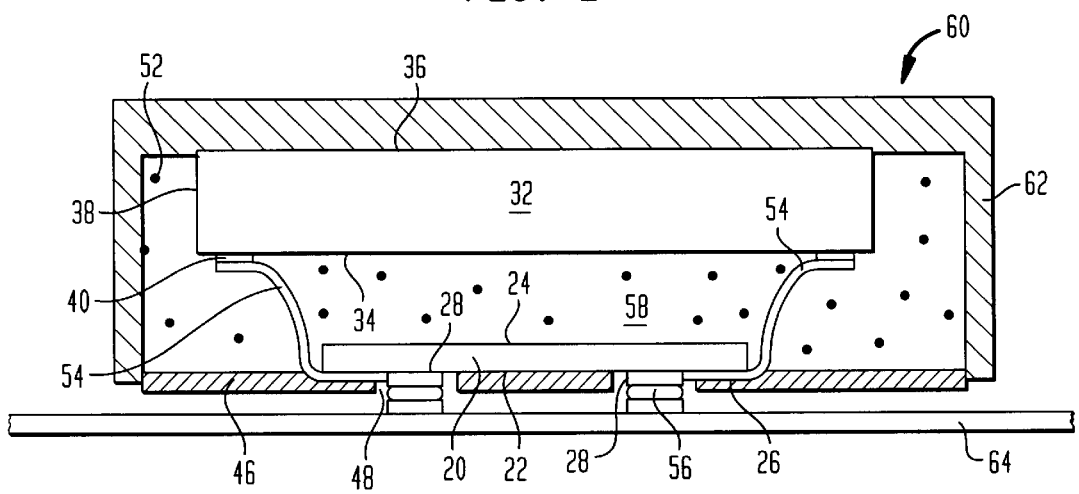
FIG. 1 is a diagrammatic, partially sectional view of a microelectronic assembly in accordance with one embodiment of the invention.

An encapsulant composition in accordance with one embodiment of the present invention is prepared by contacting a filled, curable siloxane base resin with a hardener compound for the siloxane. Essentially any curable siloxane base resin that is considered acceptable for use in encapsulant compositions for microelectronic assemblies is suitable for use in the encapsulant compositions of the present invention.

Longer chain, i.e., higher molecular weight, siloxane base resins are preferred. The preferred siloxane base resin is available from Dow Corning under the designation Q1-4939.

The curable siloxane base resin is filled with at least a bi-modal distribution, and preferably a tri-modal distribution of inorganic filler particles. The bi-modal particle packing distribution incorporates first filler particles having a first diameter and second filler particles having a second diameter smaller than the first diameter in amounts effective to provide the particle packing distribution with a relative bulk volume of at least about 90 percent.

The filler particles are preferably spherical. Examples of suitable filler particles include silica, alumina, aluminum nitride and silica-coated metals, such as silica-coated aluminum nitride. The selection of the filler is determined by the material properties that need to be modified. For example, aluminum nitride is particularly effective to increase thermal conductivity, while silica is particularly effective at reducing CTE.

The unmodified surfaces of silica and alumina fillers are populated by hydroxyl groups, i.e., silanol or aluminol groups. Chemical modification of the surface properties of these fillers can be performed by reacting the hydroxyl groups with coupling agents that form a covalently bonded coating on the surface of the filler particles having functional groups reactive with the functional groups of the hardener compound for the siloxane.

For example, filler particles to be used with vinyl siloxanes are functionalized with surface vinyl groups. Silica or alumina particles are thus reacted with vinyl-functional silizanes such as divinyl tetramethyl disilizanes to form a covalently bonded coating on the surface of the particles having reactive vinyl functional groups. The vinyl functional groups then react with the hardener compound for the vinyl siloxane base resin, so that the filler is covalently bonded to the cured polysiloxane. Other functional groups that can be deposited on the surface of the filler particles by disilizanes to be used in combination with similarly reactive siloxanes include phenol.

Filler particles may be coated with a coupling agent by forming a slurry of the particles and a stoichiometric excess of the coupling agent in a solvent for the coupling agent. For example, a slurry may be formed of amorphous silica in ethanol containing divinyl tetramethyl disilizane in an amount preferably about 5 percent by weight. The particle surfaces are completely wetted, after which the particles are recovered and dried at elevated temperature to fully react the particle surface hydroxyl groups. The particles are then pulverized and dried to remove clumps.

The filler particles can also be functionalized in situ by blending a curable siloxane base resin with untreated filler particles and a coupling agent capable of reacting with both the hydroxyl groups on the surface of the filler particles and the hardener compound for the siloxane. For siloxanes and silica particles, this would include vinyl functional silizanes, as well as silizanes functionalized with essentially any group capable of reacting with hardener compound functional groups.

The bi-modal filler particle packing distributions preferably employ first filler particles having a first diameter of about 30 microns. The first diameter may range between about 10 and about 50 microns. As will be explained in greater detail below, the first filler particles preferably have a diameter essentially equivalent to the diameter of a sub-element to be protected by the encapsulant, for example, the flexible leads protected by the encapsulant that extend between contacts on the surface of the semiconductor chip and conductive traces formed on the dielectric element on which the chip is mounted. To achieve a bi-modal filler particle distribution having an optimal relative bulk volume, second filler particles having a diameter of about 2 microns should be employed.

When filler particles having the aforementioned first and second diameters are cured in a bi-modal particle distribution, the first and second filler particle loading levels should be an amount effective to provide in the final cured encapsulant composition a particle loading of about 60 weight percent. Particle loading levels ranging between about 25 weight percent and about 75 weight percent may be used. About a 3:1 volume ratio of first filler particles to second filler particles should be employed. Curable encapsulant compositions that are not formulated with a hardener compound will contain higher filler loading levels because of the dilution that will occur when the hardener compound is added to the siloxane.

For curable encapsulant compositions having a bi-modal or tri-modal filler particle distribution, the first and second filler particles are preferably amorphous silica. For example, amorphous silica particles having a diameter of 30 microns, which are available from Denka KK of Japan under the designation FB-74X, may be used as first filler particles, and amorphous silica particles having diameters of two microns, which are also available from Denka KK of Japan under the designation FB-001X, may be used as second filler particles.

The first and second filler particles used with the bi-modal filler particle packing distributions of the present invention may also be used with the tri-modal filler particle packing distributions of the present invention. In addition to the first and second filler particles, the tri-modal particle packing distribution of the present invention incorporates third filler particles having a third diameter smaller than the second diameter, i.e., less than one micron. Like the first and second filler particles, the third filler particles may be pre-treated to deposit reactive functional groups on the particle surfaces, or such treatment may be performed in situ. Third filler particles having a diameter of about 0.10 microns are preferred.

When filler particles having the aforementioned first, second and third diameters are cured in a tri-modal particle packing distribution having the optimum 60 weight percent particle loading, the filler particle loading levels should be an amount effective to provide in the final cured encapsulant composition about 43 weight percent of the first filler particles, about 14 weight percent of the second filler particles, and about 3 weight percent of the third filler particles. The first filler particles may range between about 25 and about 50 weight percent, the second filler particles may range between about 10 and about 25 weight percent and the third filer particles may range between about 1 and about 10 weight percent.

The amount of first and second filler particles employed in tri-modal particle distributions is somewhat less than the amount employed in bi-modal particle distributions in order to accommodate the third filler particles. The total amount of the three types of filler particles in the curable encapsulant compositions will also be greater for the curable siloxanes formulated without a hardener compound.

The third filler particles are preferably fumed silica. For example, fumed silica particles having a diameter of about 0.1 microns are available from Degussa under the trade name AEROSIL® 150.

The curable elastomer compositions of the present invention are compounded by essentially conventional techniques for loading filler particles into siloxane base resins. For compositions in accordance with the present invention in which the hardener compound is packaged separately, some or all of the filler particles can be loaded into the hardener compound. However, this is not preferred because hardener compounds are typically significantly lower in viscosity than the siloxane base resins, and the filler particles tend to separate from the hardener compound, so that the compositions lack shelf stability.

To ensure adequate blending of all ingredients the mixing equipment in which the present compositions are prepared should be capable of subjecting the composition to a high rate of shear. Dough type mixers equipped with "sigma" shaped blades are not as efficient as mixers wherein the mixing services are of a relatively fat "paddle" configuration. Other mixing devices such as roll mills or static mixers may also be used.

The curable encapsulant compositions are prepared by adding the filler particles to the siloxane with additives that tend to increase viscosity being added before the additives that tend to reduce viscosity.

The dispersion of the filler and siloxane is preferably heated to about 80° C. to achieve good wetting of the filler particles by the elastomer base resin. This is preferably performed by heating the mixer, although the surface wetting can also be accomplished by subsequently baking the filled siloxane at the same temperature.

When uncoated filler particles are employed that are treated in situ with a coupling agent compound, the coupling agent compound may be added to the elastomer base resin after the filler particles are dispersed therein. For silizanes, ammonia is generated, and a vacuum should be applied to remove the ammonia, as well as any excess silizane.

For encapsulant compositions in which the hardener compound and the curable elastomer base resin are not packaged separately, the hardener compound may also be blended with the siloxane base resin at this time. The selection of a hardener compound and the amount to employ does not require experimentation, because single package kits of curable siloxanes and the hardener compounds therefor are commercially marketed. The components can be combined in the ratios recommended by the manufacturer for filled encapsulant compositions. For example, the aforementioned Q1-4939 silicone base resin is marketed by Dow Corning along with a hardener compound with the same Q1-4939 designation. Equal parts by weight of the base resin and hardener compound are used, independent of the quantity of filler in the curable encapsulant composition.

As noted above, curable encapsulant compositions containing the hardener compound for the siloxane base resin must be maintained prior to curing at a temperature below which the curing reaction takes place. For some curable siloxanes, this requires refrigeration. Such compositions are cured by warming to room temperature. Other encapsulant compositions containing the hardener compound for the curable siloxane are stable when stored at room temperature and require heating before curing will take place. For purposes of the present invention, room temperature is defined as being about 20° C.

For two component systems with separately packaged curable siloxane base resins and hardener compounds the encapsulant compositions are cured by blending the components. Some systems will cure at room temperature upon blending, while others require heating in addition to blending.

In addition to the curable base resin, filler particles, and optional coupling agent compound and hardener compound, the curable encapsulant compositions of the present invention can contain one or more additives that are conventionally present in curable compositions of this type. These materials are added to impart and to enhance certain properties of the cured encapsulant or facilitate processing of the curable composition.

Thus, curable encapsulant compositions of the present invention may further include one or more curing agents, dyes, pigments, extending fillers, compression set additives, adhesion promoters, flame retardants, heat and/or UV light stabilizers, and the like. Extending fillers are distinct from the reinforcing fillers of the present invention. Examples of curing agents include benzoyl peroxide, t-butyl perbenzoate, organotin catalyst, metal salts of carboxylic acids, organotitanates, platinum containing catalysts, and the like. Platinum-containing catalysts such as hexachloroplatinic acid are preferred.

If an opaque encapsulant is desired, an optically absorbing filler particle may be used as the reinforcing filler. For example, carbon black having a suitable diameter may be used as the second or third particle. Likewise, filler particles can have other functions, for example, as a flame retardant.

A microelectronic assembly in accordance with one embodiment of the present invention is shown in FIG. 1. This assembly is merely exemplary of the numerous different types of microelectronic assemblies which may incorporate encapsulants according to the invention. Thus, although one type of assembly is illustrated, it should be appreciated that the present encapsulants can be used in essentially any microelectronic assembly which can employ a flexible encapsulant.

The assembly incorporates a dielectric element 20 having a top surface 22 and a bottom surface 24. Dielectric element 20 is formed as a flexible sheet of a dielectric material as, for example, a sheet of polyimide. The dielectric element further includes metallic conductive traces 26 and terminals 28 disposed on the dielectric element. Only some of the metallic traces 26 and terminals 28 are visible in FIG. 1. The microelectronic element, in this case a conventional semiconductor chip 32, is disposed facing the dielectric element. Chip 32 has a top surface 34, bottom surface 36 and edges 38 extending between such surfaces. Contacts 40 are disposed on the top surface 34 of the chip.

A thin, insulating film such as a conventional solder mask 46 overlies the surface of the dielectric element and traces 26 remote from the chip. The film incorporates apertures 48 aligned with terminals 28. A plurality of flexible leads 54 extend from contacts 40 on the chip to the traces 26 of dielectric element 20, such that terminals 28 are connected to the contacts 40 on the chip 32 through the flexible leads 54.

Leads 54 may be conventional bonding wires, typically gold or aluminum bond wires, or may be bonding leads of the types shown in PCT International Publication No. WO 94/03036, the disclosure of which is hereby incorporated by reference herein. In preferred embodiments shown in the '036 publication, the bonding leads may be formed integrally with the traces. Other types of flexible leads may also be used.

Encapsulant 52 occupies the space between the top surface 34 of the chip and the bottom surface 24 of the dielectric layer. Encapsulant 58 intimately surrounds the leads or bonding wires 54. The microelectronic assembly may optionally include a thermally conductive spreader element such as a metallic can or spreader 60. A portion of the encapsulant 58 is disposed between the chip and the side walls 62 of the can 60. The enhanced thermal conductivity of the encapsulant promotes heat transfer from the chip to the can. Also, the enhanced thermal conductivity of encapsulant 58 promotes heat transfer to the dielectric element 20 and terminals 28, and hence promotes heat transfer from the chip to a circuit board 64 or other substrate to which the package is mounted.

Methods by which the microelectronic assemblies may be encapsulated include conventional encapsulation techniques as well as the methods shown in U.S. Pat. No. 5,663,106 and the method disclosed by copending and commonly-owned U.S. patent application Ser. No.08/726,697 filed Oct. 7, 1996, the disclosures of which are also incorporated herein by reference.

Preferred compositions for the encapsulation of leads 54 and associated bond points 56 and contacts 40 have first filler particles with essentially the same width. Particles of such dimension provide localized domains of increased tensile strength.

The following non-limiting examples set forth hereinbelow illustrate certain aspects of the invention. All parts and percentages are by weight unless otherwise noted, and all temperatures are in degrees Celsius. Siloxane base resin and hardener compound were obtained from Dow Corning of Midland, Mich. Amorphous silica was obtained from Denka KK of Japan. Fumed silica was obtained from Degussa.

EXAMPLES

Example 1
BI-MODAL FILLER PARTICLE DISTRIBUTION

A non-swelling encapsulant was formulated using a siloxane resin as the elastomer and a bi-modal distribution of silicon particles as the filler. FB-74X, a 30 micron amorphous silica from Denka KK was blended in a 3:1 ratio with FB-001X, a 2 micron amorphous silica, also available from Denka KK.

The particles were initially treated to attach vinyl functional groups to the particle surfaces. The particles were wet by forming a slurry of the particles with a solution of divinyl tetramethyl disilizane in ethanol in an amount effective to provide 5 g of the disilizane per 100 g of the filler particles.

The slurry was dried at 105° C. for 24 hours in order to fully treat the hydroxyl groups on the surfaces of the particles. After drying, the particles were pulverized and dried to remove clumps from the filler.

The dried particles were mixed into the silicon resin to a loading of 60 percent by weight filler particles of all particle sizes, to 40 percent by weight of silicon resin, including base and hardener. A resin of 50 percent base Q1-4939 and 50 percent hardener compound Q1-4939 was used. The composition was fully mixed and dispersed in a 3-roll mill.

The mixture was cured for 60 minutes at 150° C. followed by a final cure of 60 minutes at 200° C. The solvent resistance of the mixture was determined by immersing a sample of cured encapsulant in terpene and measuring the one dimensional swell by means of a dial micrometer. The sample was cured in a petri dish, and the resulting disk was immersed in solvent, after which the swelling from the solvent was measured.

EXAMPLE 2
TRI-MODAL FILLER PARTICLE DISTRIBUTION

The results obtained with a bi-modal filler particle distribution can be further improved with respect to solvent resistance and CTE by employing a tri-modal filler particle distribution. A very small particle, 0.1 micron fumed silica, was added to the particle distribution in small quantities in order to provide termination points for the siloxane chains. The small particles provide a mechanism for linking the larger particles by siloxane chains. The chains may be too short to link adjacent particles by direct linkage or chain entanglement. With very small particles between adjacent large particles, the siloxane chains covalently linked to a larger first or second particle may covalently attach to a smaller third particle, which, in turn, may be liked by a second siloxane chain to another larger first or second particle.

In the embodiments without the smaller third particles, in which siloxane chains are covalently attached to larger first and second particles, moderate levels of filler loading covalently link the filler particles together indirectly by entanglement of the siloxane chains. This is not as strong a linkage as the covalent attachment of larger first or second particles through an intermediate smaller third particle.

A non-swelling encapsulant was formulated using a siloxane resin as the elastomer as in Example 1, except that a tri-modal distribution of silicon particles was employed as the filler. The FB-74X and FB-001X were combined with AEROSIL® 150, a 0.1 micron fumed silica aggregate, from Degussa. The filler particles were combined in a 43:14:3 ratio of the 30 micron amorphous silica particles to the 2 micron amorphous silica particles to the 0.1 micron fumed silica.

The filler particles were treated with divinyl tetramethyl disilizane as in Example 1. The treated particles were mixed into the 50:50 ratio of Q1-4939 resin base and hardener compound ratio of 60 percent filler particles to 40 percent silicon resin, also as in Example 1.

The encapsulant was cured, and the solvent resistance was determined, also as in Example 1.

A small amount of fumed silica particles was thus able to provide a large number of intermediate linkage points for covalently attaching siloxane chains that are in turn, covalently linked to larger filler particles. By using fumed silica, adjacent large particles can be covalently linked together by flexible but relatively inextensible elastomer chains that prevent solvent swell and thermal expansion.

The foregoing examples and description of the preferred embodiment should be taken as illustrating, rather as limiting, the present invention as defined by the claims. Numerous variations and combinations of the features set forth above can be utilized without departing from the presently claimed invention. Such variations are not regarded as a departure from the spirit and scope of the invention, and are intended to be included within the scope of the following claims.

What is claimed is:

1. A filled, curable siloxane encapsulant composition, comprising a curable siloxane base resin with functional groups reactive with functional groups of a hardener compound to form a polysiloxane, and filler particles comprising a chemically-modified surface having functional groups capable of reacting with the functional groups of the hardener compound, wherein said filler particles comprise at least a bi-modal particle packing distribution of first filler particles with a first diameter and second filler particles with a second diameter smaller than said first diameter, and said first and second filler particles are present in amounts effective to provide a particle packing distribution with a relative bulk volume of at least about 90 percent, whereby the filler particles are bonded to the polysiloxane upon curing of the encapsulant composition with said hardener.

2. The curable encapsulant composition of claim 1, wherein said filler particle functional groups comprise vinyl or phenol functional groups.

3. The curable encapsulant composition of claim 1, wherein said first diameter is between about 10 and about 50 microns and said second diameter is between about 1 and about 10 microns.

4. The curable encapsulant composition of claim 1, wherein the volume ratio of said first filler particles to said second filler particles is about 3:1.

5. The curable encapsulant composition of claim 1, wherein said first and second filler particles are present at a loading level of about 60 weight percent.

6. The curable encapsulant composition of claim 1, further including a hardener compound having said hardener compound functional groups for said siloxane base resin in an amount effective to cure said siloxane.

7. The curable encapsulant composition of claim 1, wherein said first and second filler particles comprise amorphous silica.

8. The curable encapsulant composition of claim 1, wherein said first and second filler particles comprise spherical filler particles.

9. The curable encapsulant composition of claim 1, wherein said first and second filler particles are selected from the group consisting of silica, alumina, aluminum nitride and silica-coated metal filler particles.

10. The curable encapsulant composition of claim 1, comprising a tri-modal particle packing distribution of said first and second filler particles and third filler particles with a third diameter smaller than said second diameter, wherein said first, second and third filler particles are present in amounts effective to provide a tri-modal particle packing distribution with a relative bulk volume of at least about 95 percent.

11. The curable encapsulant composition of claim 9, wherein said silica-coated metal filler particles comprise silica-coated aluminum nitride filler particles.

12. The curable encapsulant composition of claim 6, wherein said siloxane functional groups and said hardener compound functional groups react at room temperature.

13. The curable encapsulant composition of claim 6, wherein said siloxane functional groups and said hardener compound functional groups react at a temperature above room temperature.

14. The curable encapsulant composition of claim 10, wherein said third filler particles have a diameter of about 0.10 microns.

15. The curable encapsulant composition of claim 10, wherein said first filler particles are present at a loading level of about 43 percent by weight, said second filler particles are present at a loading level of about 14 percent by weight, and said third filler particles are present at a loading level of about 3 percent by weight.

16. The curable encapsulant composition of claim 10, wherein said third filler particles are selected from the group consisting of silica, alumina, aluminum nitride and silica-coated metal particles.

17. The curable encapsulant composition of claim 16, wherein said third filler particles comprise fumed silica.

18. A filled, cured, elastomer encapsulant composition, comprising a polysiloxane and filler particles individually covalently bonded to one or more polymer chains of said polysiloxane, wherein said filler particles comprise at least a bi-modal packing distribution of first filler particles with a first diameter and second filler particles with a second diameter smaller than said first diameter, and said first and second filler particles are present in amounts effective to provide a bi-modal particle packing distribution with a relative bulk volume of at least about 90 percent.

19. The cured encapsulant composition of claim 18, wherein said first diameter is between about 10 and about 50 microns and said second diameter is between about 1 and about 10 microns.

20. The cured encapsulant composition of claim 18, comprising about 60 percent by weight of said first and second filler particles.

21. The cured encapsulant composition of claim 18, wherein the volume ratio of said first filler particles to said second filler particles is about 3:1.

22. The cured encapsulant composition of claim 18, wherein said first and second filler particles comprise spherical filler particles.

23. The cured encapsulant composition of claim 18, wherein said filler particles are bonded to the polysiloxane chains via a coupling agent, said coupling agent having a first functional group attached to a surface of the individually bound particles, and a second functional group attached to the one or more polymer chains of the polysiloxane.

24. The cured encapsulant composition of claim 18, wherein said first and second filler particles are selected from the group consisting of silica, alumina, aluminum nitride and silica-coated metal filler particles.

25. The cured encapsulant composition of claim 18, comprising a tri-modal filler particle packing distribution of said first and second filler particles and third filler particles having a third diameter smaller than said second diameter, wherein said first, second and third filler particles are present in amounts effective to provide a tri-modal particle packing distribution with a relative bulk volume of at least about 95 percent.

26. The cured encapsulant composition of claim 24, wherein said silica-coated metal filler particles are silica-coated aluminum nitride filler particles.

27. The cured encapsulant composition of claim 24, wherein said first and second filler particles comprise amorphous silica.

28. The cured encapsulant composition of claim 25, wherein said third filler particles are selected from the group consisting of silica, alumina, aluminum nitride and silica-coated metal filler particles.

29. The cured encapsulant composition of claim 25, wherein said third filler particles have a diameter of about 0.10 microns.

30. The cured encapsulant composition of claim 28, wherein said third filler particles comprise fumed silica.

31. The cured encapsulant composition of claim 28, comprising from about 43 percent by weight of said first filler particles, about 14 percent by weight of said second filler particles, and about 3 percent by weight of said third filler particles.

32. An assembly comprising a microelectronic element at least partially surrounded by the cured encapsulant composition of claim 18.

33. The assembly of claim 32, wherein said encapsulant comprises a tri-modal filler particle packing distribution of said first and second filler particles and third filler particles having a third diameter smaller than said second diameter, wherein said first, second and third filler particles are present in amounts effective to provide a tri-modal particle packing distribution with a relative bulk volume and at least about 90 percent.

34. The assembly of claim 32, wherein said microelectronic assembly includes a semiconductor chip having contacts thereon, said assembly further comprising flexible leads extending to said contacts, with said encapsulant encapsulating said flexible leads.

35. The assembly of claim 34, wherein said encapsulant additionally surrounds said contacts on said front surface of said chip.

36. The assembly of claim 34, further comprising a dielectric element having terminals thereon connected to said contacts by said flexible leads.

37. The assembly of claim 36, wherein said dielectric element is flexible.

38. An encapsulant kit comprising a first package containing a filled curable siloxane base resin composition, substantially free of a hardener compound for said siloxane, and, in a separate package, a hardener compound for said siloxane having functional groups thereon, wherein said siloxane composition comprises a curable siloxane base resin with functional groups reactive with said functional groups on said hardener compound to form a polysiloxane, and filler particles comprising a chemically-modified surface having functional groups capable of reacting with the functional groups of the hardener compound, wherein said filler particles comprise at least a bi-modal particle packing distribution of first filler particles with a first diameter and second filler particles with a second diameter smaller than said first diameter, and the first and second filler particles are present in amounts effective to provide a particle packing distribution with a relative bulk volume of at least about 90 percent, whereby the filler particles are bonded to the polysiloxane upon curing with said hardener.

39. The encapsulant kit of claim 38, wherein said first and second filler particles are present at a loading level of about 60 percent by weight.

40. The encapsulant kit of claim 38, wherein said siloxane functional groups and said hardener compound functional groups react at room temperature.

41. The encapsulant kit of claim 38, wherein said siloxane functional groups and said hardener compound functional groups react at a temperature above room temperature.

42. The encapsulant kit of claim 38, wherein said first and second filler particles comprise spherical filler particles.

43. The encapsulant kit of claim 38, wherein said filler particles are selected from the group consisting of silica, alumina, aluminum nitride and silica-coated metal filler particles.

44. The encapsulant kit of claim 38, wherein said first filler particles have a diameter of between about 10 and 50 microns and said second filler particles have a diameter of between about 1 and 10 microns.

45. The encapsulant kit of claim 38, wherein said base resin composition further comprises third filler particles with a third diameter smaller than said second diameter in a tri-modal particle packing distribution with said first and second filler particles, wherein said first, second and third filler particles are present in amounts effective to provide a particle packing distribution with a relative bulk volume of at least about 95 percent.

46. The encapsulant kit of claim 43, wherein said silica-coated metal filler particles comprise silica-coated aluminum nitride.

47. The encapsulant kit of claim 43, wherein said first and second filler particles comprise amorphous silica.

48. The encapsulant kit of claim 44, wherein the volume ratio of said first filler particles to said second filler particles is about 3:1.

49. The encapsulant kit of claim 44, wherein said filler particle functional groups comprise vinyl or phenol functional groups.

50. The encapsulant kit of claim 45, wherein said third particles have a diameter of about 0.10 microns.

51. The encapsulant kit of claim 45, wherein said base resin composition comprises about 43 percent by weight of said first filler particles, about 14 percent by weight of said second filler particles, and about 3 percent by weight of said third filler particles.

52. The encapsulant kit of claim 45 wherein said third filler particles are selected from the group consisting of silica, alumina, aluminum nitride and silica-coated metal filler particles.

53. The encapsulant kit of claim 52, wherein said third particles comprise fumed silica.

54. A filled, curable siloxane encapsulant composition, comprising
   A) a curable siloxane base resin with functional groups reactive with functional groups of a hardener compound to form a polysiloxane;
   B) filler particles comprising a surface capable of chemical modification; and
   C) a coupling agent capable of reacting with the surface of the filler particles and the hardener compound,
wherein said filler particles comprise at least a bi-modal particle packing distribution of first filler particles with a first diameter and second filler particles with a second diameter smaller than said first diameter, and said first and second filler particles are present in amounts effective to provide a particle packing distribution with a relative bulk volume of at least about 90 percent, whereby the filler particles are bonded to the polysiloxane upon curing of the encapsulant composition with said hardener.

55. The curable encapsulant composition of claim 54, wherein said filler particle functional groups comprise vinyl or phenol functional groups.

56. The curable encapsulant composition of claim 54, wherein said first diameter is between about 10 and about 50 microns and said second diameter is between about 1 and about 10 microns.

57. The curable encapsulant composition of claim 54, wherein the volume ratio of said first filler particles to said second filler particles is about 3:1.

58. The curable encapsulant composition of claim 54, wherein said first and second filler particles are present at a loading level of about 60 weight percent.

59. The curable encapsulant composition of claim 54, further including a hardener compound having said hardener compound functional groups for said siloxane base resin in an amount effective to cure said siloxane.

60. The curable encapsulant composition of claim 54, wherein said first and second filler particles comprise amorphous silica.

61. The curable encapsulant composition of claim 54, wherein said first and second filler particles are selected from the group consisting of silica, alumina, aluminum nitride and silica-coated metal filler particles.

62. The curable encapsulant composition of claim 54, comprising a tri-modal particle packing distribution of said first and second filler particles and third filler particles with a third diameter smaller than said second diameter, wherein said first, second and third filler particles are present in amounts effective to provide a tri-modal particle packing distribution with a relative bulk volume of at least about 95 percent.

63. The curable encapsulant composition of claim 54, wherein said first and second filler particles comprise spherical filler particles.

64. The curable encapsulant composition of claim 61, wherein said silica-coated metal filler particles comprise silica-coated aluminum nitride filler particles.

65. The curable encapsulant composition of claim 59, wherein said siloxane functional groups and said hardener compound functional groups react at room temperature.

66. The curable encapsulant composition of claim 59, wherein said siloxane functional groups and said hardener compound functional groups react at a temperature above room temperature.

67. The curable encapsulant composition of claim 62, wherein said third filler particles are selected from the group consisting of silica, alumina, aluminum nitride and silica-coated metal particles.

68. The curable encapsulant composition of claim 62, wherein said third filler particles have a diameter of about 0.10 microns.

69. The curable encapsulant composition of claim 62, wherein said first filler particles are present at a loading level of about 43 percent by weight, said second filler particles are present at a loading level of about 14 percent by weight, and said third filler particles are present at a loading level of about 3 percent by weight.

70. The curable encapsulant composition of claim 67, wherein said third filler particles comprise fumed silica.

* * * * *

UNITED STATES PATENT AND TRADEMARK OFFICE
CERTIFICATE OF CORRECTION

PATENT NO. : 6,255,738 B1
DATED : July 3, 2001
INVENTOR(S) : Thomas H. DiStefano, Craig Mitchell, Mark Thorson and Zlata Kovac Page 1 of 1

It is certified that error appears in the above-identified patent and that said Letters Patent is hereby corrected as shown below:

<u>Title page,</u>
Item [75], Inventors Section: Distephano should read -- DiStefano --*

<u>Column 1,</u>
Line 38, "an" should read -- a --.

<u>Column 2,</u>
Line 50, after "have" insert -- at --.

<u>Column 3,</u>
Line 55, after "ticles" insert -- to --.

<u>Column 7,</u>
Line 12, "filer" should read -- filler --.

<u>Column 10,</u>
Line 35, "liked" should read -- linked --.

<u>Column 11,</u>
Line 23, "polvsiloxane" should read -- polysiloxane --.

<u>Column 13,</u>
Line 6, "28" should read -- 29 --.
Line 19, "and" should read -- of --.

Signed and Sealed this

Twenty-eighth Day of May, 2002

Attest:

JAMES E. ROGAN
*Attesting Officer*   *Director of the United States Patent and Trademark Office*